US007391273B2

(12) United States Patent
Seki et al.

(10) Patent No.: US 7,391,273 B2
(45) Date of Patent: Jun. 24, 2008

(54) CLOCK SIGNAL OUTPUT APPARATUS AND CONTROL METHOD OF SAME, AND ELECTRIC APPARATUS AND CONTROL METHOD OF SAME

(75) Inventors: Shigeaki Seki, Matsumoto (JP); Katsutoyo Inoue, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 85 days.

(21) Appl. No.: 11/360,664

(22) Filed: Feb. 24, 2006

(65) Prior Publication Data

US 2006/0202771 A1 Sep. 14, 2006

(30) Foreign Application Priority Data

Feb. 24, 2005 (JP) ............................ 2005-048269

(51) Int. Cl.
*H03L 7/00* (2006.01)

(52) U.S. Cl. ............................ 331/47; 331/14; 331/30; 331/175; 368/201

(58) Field of Classification Search .................... 331/2, 331/14, 18, 25, 30, 46, 47, 1 A, 116 R, 158, 331/175, 176, 94.1; 368/47, 52, 159, 200, 368/201
See application file for complete search history.

(56) References Cited

U.S. PATENT DOCUMENTS 3,531,739 A * 9/1970 Groves .................. 331/116 R
3,757,510 A * 9/1973 Dill ............................ 368/87
3,783,408 A * 1/1974 Bird .......................... 331/135
4,899,117 A * 2/1990 Vig ............................. 331/3
6,265,945 B1 7/2001 Delaney et al.
6,734,738 B2 * 5/2004 Ichimaru .................... 331/14
6,806,784 B2 10/2004 Hollberg et al.
2003/0214436 A1 * 11/2003 Voor et al. ................. 342/418
2006/0176777 A1 * 8/2006 Ihara .......................... 368/47

FOREIGN PATENT DOCUMENTS

| | | | |
|---|---|---|---|
| JP | 6147580 | A | 3/1986 |
| JP | 2000174621 | A | 6/2000 |
| JP | 2002139585 | A | 5/2002 |
| JP | 2002228778 | A | 8/2002 |

* cited by examiner

*Primary Examiner*—Robert J. Pascal
*Assistant Examiner*—Ryan J Johnson
(74) *Attorney, Agent, or Firm*—Global IP Counselors, LLP

(57) ABSTRACT

The clock signal output device has a crystal oscillator for generating a reference clock signal and generating and outputting an output clock signal having a prescribed frequency on the basis of the reference clock signal. The device also has an atomic oscillator for generating a clock signal having higher precision than a crystal oscillator, an intermittent time management unit for intermittently driving the atomic oscillator, and a correction unit for receiving correction data for correcting the offset amount of the output clock signal on the basis of a clock signal each time the atomic oscillator is driven, and correcting the output clock signal on the basis of the correction data.

21 Claims, 13 Drawing Sheets

| TEMPERATURE | ... | −10 | −9 | −8 | ... | 23 | 24 | 25 | 26 | 27 | ... | 39 | 40 | 41 | ... |
|---|---|---|---|---|---|---|---|---|---|---|---|---|---|---|---|
| CORRECTION DATA | ... | D1 (−10) | D1 (−9) | D1 (−8) | ... | D1 (23) | D1 (24) | D1 (25) | D1 (26) | D1 (27) | ... | D1 (39) | D1 (40) | D1 (41) | ... |

CLOCK SIGNAL OUTPUT APPARATUS AND CONTROL METHOD OF SAME, AND ELECTRIC APPARATUS AND CONTROL METHOD OF SAME

TECHNOLOGICAL FIELD OF THE INVENTION

The present invention relates to clock signal output device which is provided with a reference oscillator for generating a reference clock signal, and which generates and outputs an output clock signal having a prescribed frequency on the basis of the reference clock signal, as well as to a control method thereof, an electronic apparatus, and a control method thereof.

PRIOR ART

Conventionally, there are electronic clocks that output a reference clock signal from a reference oscillator and divide the signal to generate, for example, a 1-Hz signal, and the clocks measure time on the basis of the 1-Hz signal. This type of electronic clock is known as a very-high-precision clock (annual) that achieves an accuracy that is within plus or minus several tens of seconds per year by using a temperature-compensated crystal oscillator as the reference oscillator (Patent Reference 1, for example). In recent years, standard oscillators that use an atomic oscillator have been proposed (Patent References 2 and 3, for example).

[Patent Reference 1] Japanese Laid-Open Patent Application 6-31731

[Patent Reference 2] U.S. Pat. No. 6,806,784

[Patent Reference 3] U.S. Pat. No. 6,265,945

DISCLOSURE OF THE INVENTION

[Problems the Invention is Intended to Solve]

However, since a conventional temperature-compensated crystal oscillator is configured to compensate for the temperature characteristics of a crystal that has third-order characteristics by using the temperature characteristics of a capacitance that has second order characteristics, a temperature variation occurs in the oscillating frequency. This type of crystal oscillator suffers from long term changes in the oscillating frequency due to the aging characteristics of the crystal, and the frequency precision is inferior in comparison with an atomic oscillator.

When an attempt is made to use an atomic oscillator as the reference oscillator of an electronic clock, the atomic oscillator reduces the life of the battery because power consumption is high in comparison with a crystal oscillator.

The present invention was contrived in view of the situation described above, and an object thereof is to provide a clock signal output device that can improve the precision of a clock signal while avoiding an increase in the overall power consumption even if a high-precision oscillator with relatively high power consumption is used, and to provide a control method thereof, an electronic apparatus, and a control method thereof.

[Means Used to Solve the Above-Mentioned Problems]

In order to solve the above-described problems, the present invention provides a clock signal output device that comprises a reference oscillator for generating a reference clock signal, and generating and outputting an output clock signal having a prescribed frequency from the reference clock signal, wherein the device has a high-precision oscillator for generating a high-precision clock signal having higher precision than the reference oscillator; an intermittent drive unit for intermittently driving the high-precision oscillator; and a correction unit for obtaining correction data that corrects for the offset amount of the output clock signal on the basis of the high-precision clock signal, and correcting the output clock signal on the basis of the correction data each time the high-precision oscillator is driven.

In accordance with this configuration, the device has a high-precision oscillator for generating a high-precision clock signal having higher precision than the reference oscillator; an intermittent drive unit for intermittently driving the high-precision oscillator; and a correction unit for obtaining correction data that corrects for the offset amount of the output clock signal on the basis of the high-precision clock signal, and correcting the output clock signal on the basis of the correction data each time the high-precision oscillator is driven. Therefore, the precision of the output clock signal can be improved based on the high-precision oscillator while intermittently stopping the high-precision oscillator and avoiding an increase in the overall power consumption even if a high-precision oscillator with relatively high power consumption is used.

Preferably provided in the above configuration is a reference oscillator effect information detector for detecting reference oscillator effect information that affects the operation of the reference oscillator, and when the reference oscillator effect information is detected, the intermittent drive unit drives the high-precision oscillator and the correction unit receives correction data.

In accordance with this configuration, the high-precision oscillator is driven and correction data is obtained when reference oscillator effect information that affects the operation of the reference oscillator is detected. Therefore, a frequency change caused by the reference oscillator effect information can be rapidly corrected, and the precision of the output clock signal can be increased.

The above-described configuration is preferably provided with a reference oscillator effect information detector for detecting reference oscillator effect information that affects the operation of the reference oscillator, and a storage unit for storing the first correction data, and a pacing logic circuit for generating the pacing signal on the basis of the first correction data. When the reference oscillator effect information is detected and the reference oscillator effect information is an initially detected value, the intermittent drive unit drives the high-precision oscillator, and the correction unit receives the correction data, stores the correction data in the storage unit, and corrects the output clock signal on the basis of the correction data. When the detected reference oscillator effect information is not the initially detected value, the output clock signal is corrected on the basis of the correction data that corresponds to the value of the reference oscillator effect information stored in the storage unit. In accordance with this configuration, the high-precision oscillator is driven only when the detected reference oscillator effect information is the initially detected value. Therefore, the number of times the high-precision oscillator is driven can be reduced and power consumption can be lowered.

In the above-described configuration, the intermittent drive unit preferably drives the high-precision oscillator when the detected reference oscillator effect information is the value that was initially detected during the predetermined correction data update interval; and the high-precision oscillator is preferably kept in a non-driving state when the detected reference oscillator effect information is not the value that was initially detected during the correction data update interval.

In accordance with this configuration, lower power consumption can be ensured since the high-precision oscillator is held in a non-driving state when the detected reference oscillator effect information is not the value that was initially detected during the correction data update interval. New correction data can be obtained each time the correction data update interval elapses, and the stored correction data can be updated since the high-precision oscillator is driven when the detected reference oscillator effect information is the value that was initially detected during the correction data update interval. The correction data can thereby be updated in accordance with frequency variation caused by the aging characteristics or other aspects of the reference oscillator, and the precision of the output clock signal can be further increased.

In the above-described configuration, the reference oscillator effect information preferably includes at least any of following information: temperature variation, humidity variation, electric power of the power supply, and posture or direction of the center of gravity of the clock signal output device.

In the above-described configuration, a high-precision oscillator effect information detector for detecting high-precision oscillator effect information that affects the operation of the high-precision oscillator is preferably provided, and the high-precision oscillator is preferably kept in a non-driving state during the interval in which the high-precision oscillator effect information is detected. In accordance with this configuration, situations in which the high-precision oscillator is driven in an unstable operating state can be avoided since the high-precision oscillator is kept in a non-driving state during the interval in which the high-precision oscillator effect information that affects the operation of the high-precision oscillator is detected. Another feature of the above-described configuration is that the high-precision oscillator effect information may include at least a magnetic field or power supply power.

In the above-described configuration, the reference oscillator preferably consumes less power than the high-precision oscillator, and a crystal oscillator, a CR oscillator, or a MEMS oscillator may be used as the reference oscillator. The high-precision clock signal may be a signal with a higher frequency than the reference clock signal, and the high-precision oscillator may be an oscillator in which an atomic oscillator, a temperature-compensated crystal oscillator, a oven controlled crystal oscillator, or an AT-cut oscillator is used.

In the above-described configuration, a comparator may be provided for comparing the phases or compares the frequencies of a reference clock signal and a high-precision clock signal, and the intermittent drive unit may drive the comparator only during the drive interval of the high-precision oscillator in order to further reduce power consumption.

In the above-described configuration, the intermittent drive unit preferably extends the intermittent driving cycle in a stepwise fashion in accordance with the aging characteristics of the reference oscillator. In accordance with this configuration, the number of times that the high-precision oscillator is driven can be reduced and lower power consumption can be assured while inhibiting aging-induced frequency variation.

The present invention provides a method for controlling a clock signal output device that comprises a reference oscillator for generating a reference clock signal, and generating and outputting an output clock signal having a prescribed frequency on the basis of the reference clock signal, wherein a high-precision oscillator for generating a high-precision clock signal having higher precision than the reference oscillator is intermittently driven, correction data is obtained for correcting the offset amount of the output clock signal on the basis of the high-precision clock signal each time the high-precision oscillator is driven, and the output clock signal is corrected on the basis of the correction data.

In accordance with this configuration, a high-precision oscillator for generating a high-precision clock signal having higher precision than the reference oscillator is intermittently driven, correction data is obtained for correcting the offset amount of the output clock signal on the basis of the high-precision clock signal, and the output clock signal is corrected on the basis of the correction data each time the high-precision oscillator is driven. Therefore, the precision of the output clock signal can be improved while avoiding an increase in the overall power consumption even if a high-precision oscillator with relatively high power consumption is used.

The present invention provides an electronic apparatus comprising a clock signal output unit for generating and outputting an output clock signal having a prescribed frequency on the basis of a reference clock signal output from a reference oscillator, wherein the apparatus is provided with a high-precision oscillator for generating a high-precision clock signal having higher precision than the reference oscillator; an intermittent drive unit for intermittently driving the high-precision oscillator; and a correction unit for obtaining correction data that corrects for the offset amount of the output clock signal on the basis of the high-precision clock signal, and correcting the output clock signal on the basis of the correction data each time the high-precision oscillator is driven.

In accordance with this configuration, the apparatus is provided with a high-precision oscillator for generating a high-precision clock signal having higher precision than the reference oscillator; an intermittent drive unit for intermittently driving the high-precision oscillator; and a correction unit for obtaining correction data that corrects for the offset amount of the output clock signal on the basis of the high-precision clock signal, and correcting the output clock signal on the basis of the correction data each time the high-precision oscillator is driven. Therefore, the precision of the output clock signal can be improved while avoiding an increase in the overall power consumption even if a high-precision oscillator with relatively high power consumption is used.

In the above-described configuration, the electronic apparatus may be configured as a clock having a time display unit that displays time on the basis of the output clock signal. The electronic apparatus preferably houses a power supply unit for feeding operating power to the electronic apparatus. In accordance with this configuration, electronic apparatus that houses a power supply unit can operate over a long period of time.

The present invention further provides a method for controlling an electronic apparatus comprising a clock signal output unit for generating and outputting an output clock signal having a prescribed frequency on the basis of a reference clock signal output from a reference oscillator, wherein a high-precision oscillator for generating a high-precision clock signal having higher precision than the reference oscillator is intermittently driven, correction data is obtained that corrects for the offset amount of the output clock signal on the basis of the high-precision clock signal each time the high-precision oscillator is driven, and the output clock signal is corrected on the basis of the correction data.

In accordance with this configuration, the high-precision oscillator for generating a high-precision clock signal having higher precision than the reference oscillator is intermittently driven, correction data is obtained that corrects for the offset amount of the output clock signal on the basis of the high-precision clock signal each time the high-precision oscillator is driven, and the output clock signal is corrected on the basis of the correction data. Therefore, the precision of the output clock signal can be improved while avoiding an increase in the overall power consumption even if a high-precision oscillator with relatively high power consumption is used.

[Effects of the Invention]

The present invention comprises a high-precision oscillator for generating a high-precision clock signal having higher precision than the reference oscillator; an intermittent drive unit for intermittently driving the high-precision oscillator; and a correction unit for obtaining correction data that corrects for the offset amount of the output clock signal on the basis of the high-precision clock signal, and correcting the output clock signal on the basis of the correction data each time the high-precision oscillator is driven. Therefore, the precision of the output clock signal can be improved based on the high-precision oscillator while avoiding an increase in the overall power consumption by intermittently stopping the high-precision oscillator, even if a high-precision oscillator with relatively high power consumption is used.

In the present invention, a high-precision oscillator is driven and correction data is obtained when reference oscillator effect information that affects the operation of the reference oscillator is detected. Therefore, frequency variations caused by the reference oscillator effect information can be rapidly corrected, and the precision of the output clock signal can be further increased.

In the present invention, the high-precision oscillator is driven when the detected reference oscillator effect information is the value that was initially detected during the predetermined correction data update interval, and the high-precision oscillator is kept in a non-driving state when the detected reference oscillator effect information is not the value that was initially detected during the correction data update interval. Therefore, the number of times that the high-precision oscillator is driven can be reduced and lower power consumption can be assured. In this case, since new correction data is obtained by driving the high-precision oscillator each time the correction data update interval elapses, the correction data can be updated in accordance with frequency variation caused by the aging characteristics or other aspects of the reference oscillator, and the precision of the output clock signal can be further increased.

Another feature of the present invention is that the high-precision oscillator is kept in a non-driving state during the detection interval of the high-precision oscillator effect information that affects the operation of the high-precision oscillator. Therefore, situations in which the high-precision oscillator is driven in an unstable operating state can be avoided.

BEST MODE FOR CARRYING OUT THE INVENTION

Embodiments of the present invention are described below with reference to the diagrams. It is apparent to those skilled in the art that the description of the embodiments of the present invention is used merely to describe the present invention and does not limit the present invention, which is defined by the accompanying claims or equivalents thereof.

Embodiment 1

Figure 1:
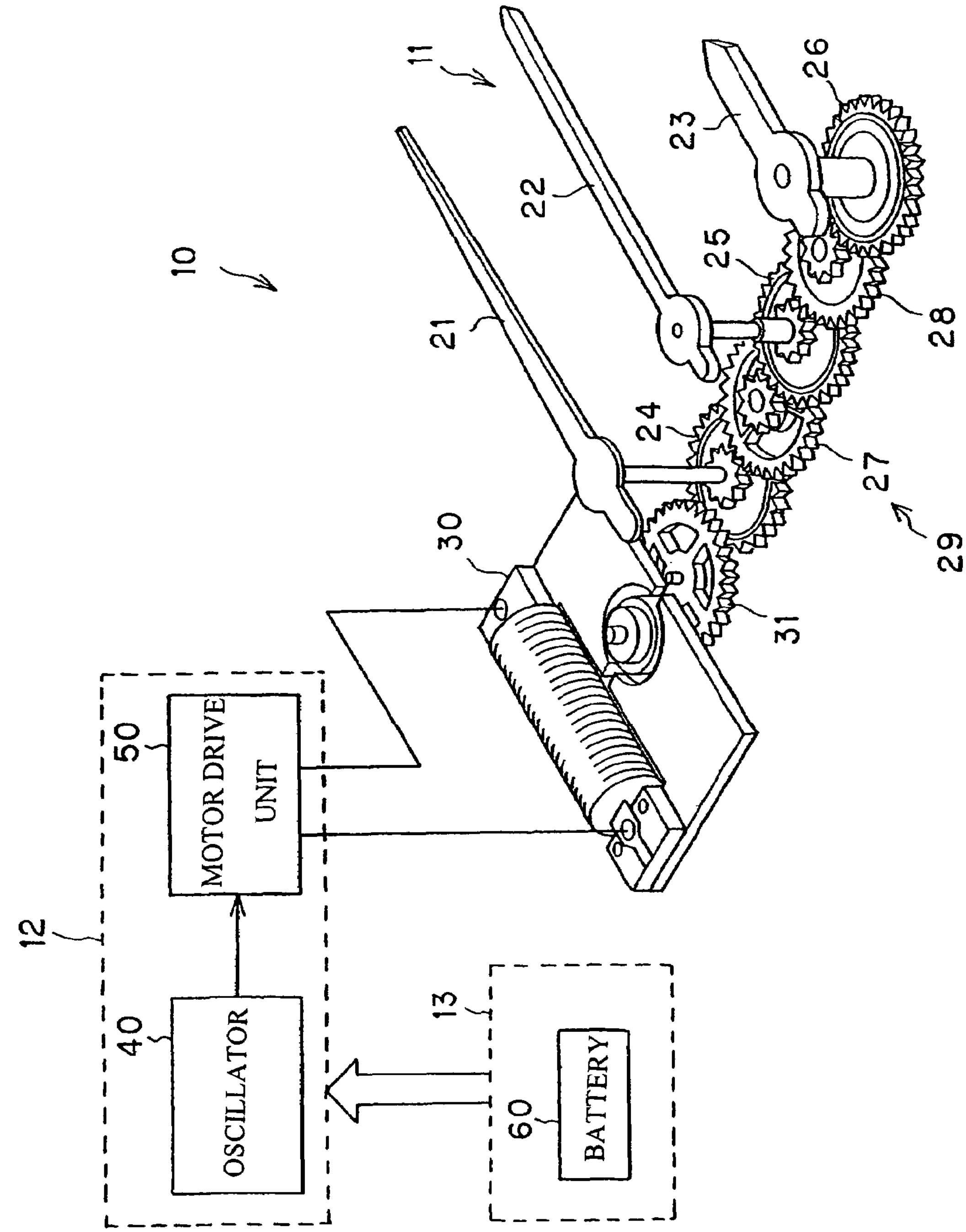
FIG. 1 A block diagram showing the configuration of the wristwatch of the first embodiment of the present invention FIG. 2 A block diagram showing the configuration of the oscillation unit FIG. 3 A diagram used to describe the comparator circuit FIG. 4 A diagram showing the clock signal after correction FIG. 5 A flowchart showing the operation of the oscillation unit FIG. 6

FIG. 1 is a block diagram showing the configuration of the wristwatch of the first embodiment of the present invention. The wristwatch (electronic clock) 10 is provided with a hand movement mechanism 11 that constitutes a clock module, a drive unit 12, and a power supply unit 13 for feeding operating power to the clock module.

The hand movement mechanism 11 is composed of a time display unit in which a seconds hand (time display unit) 21, a minute hand (time display unit) 22, and an hour hand (time display unit) 23 are driven and time is displayed, and has gear train wheels 29 that are linked by way of intermediate wheels 27 and 28 so that a seconds wheel 24, a center wheel and pinion 25, and the hour wheel 26 operate in mutual coordination, as shown in the diagram. One end of the seconds hand 21 is mounted on the rotating shaft of the seconds wheel 24, one end of the minute hand 22 is mounted on the rotating shaft of the center wheel and pinion 25, and one end of the hour hand 23 is mounted on the rotating shaft of the hour wheel 26. The gear wheel 31 of a drive motor 30 meshes with the seconds wheel 24, the seconds wheel 24 is rotatably driven by the rotation of the drive motor 30, the rotation is transmitted to the center wheel and pinion 25 and hour wheel 26, and the seconds hand 21, minute hand 22, and hour hand 23 are rotatably driven. Time is displayed by these hands 21 to 23.

The drive unit 12 is provided with an oscillation unit (clock signal output unit) 40 and a motor drive unit (drive unit) 50. The oscillation unit 40 outputs a 1-Hz clock signal (output clock signal) CL0, and the motor drive unit 50 feeds drive pulses to the drive motor 30 on the basis of the 1-Hz clock signal CL0 to drive the drive motor 30. The wristwatch 1 may be provided with a liquid crystal display device in place of the hand movement mechanism 11 or in addition to the hand movement mechanism 11, and may be configured to display time on the liquid crystal display device. In this case, the drive unit 12 may be configured with a clock counter for counting the 1-Hz clock signal CL0, and a liquid crystal drive unit for driving the liquid crystal display device on the basis of the count value.

The power supply unit 13 is configured with a battery 60 disposed within the wristwatch 10, and a constant voltage circuit (not shown) for converting power stored in the battery 60 to constant voltage and feeding the constant voltage to the components of the drive unit 12. A lithium battery, silver battery, or another coin-type primary battery is used as the battery 60. A solar panel or another power generation unit may be disposed in the wristwatch 10, and in such a case, a secondary battery is used as the battery 60.

Figure 2:
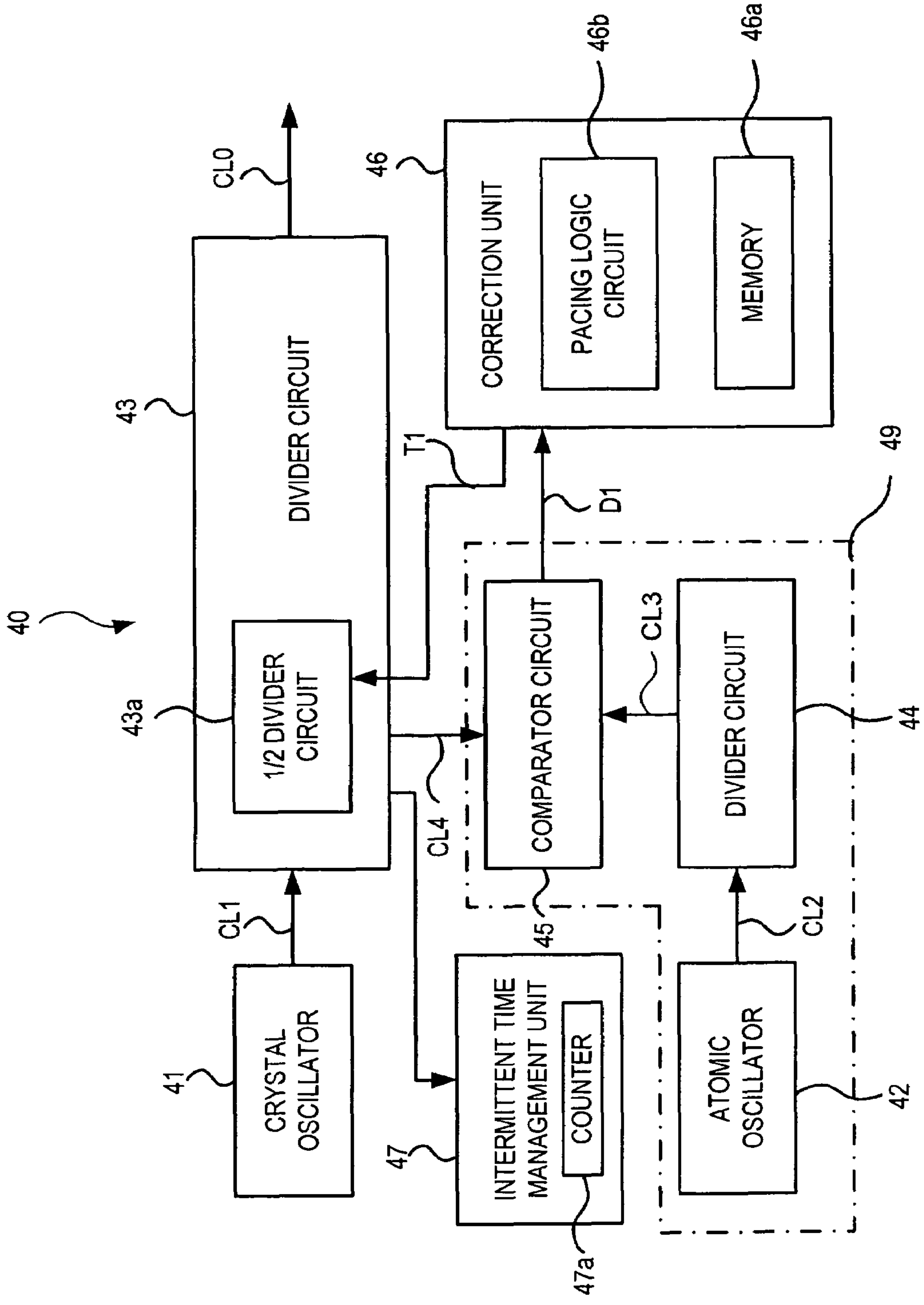

In the present embodiment, the oscillation unit 40 is provided with a crystal oscillator (reference oscillation unit, reference oscillation device) 40 and an atomic oscillator (high-precision oscillator, high precision oscillation device) 42, as shown in FIG. 2. The crystal oscillator 41 is an oscillator for causing a tuning fork-type crystal oscillator to oscillate and outputting, for example, a reference clock signal CL1 of 32.768 kHz. The atomic oscillator 42 is an oscillator which is obtained using a cesium atomic oscillator with higher frequency precision and frequency stability than the crystal oscillator 41, and which outputs a clock signal CL2 of 9.2 GHz, for example. An atomic oscillator (a rubidium atomic oscillator, for example) other than a cesium atomic oscillator may be used. Also, the crystal oscillator 41 may be any crystal oscillator that is used in a very-high-precision clock (annual), a very-high-precision clock (monthly), or the like.

The oscillation unit 40 is provided with a divider circuit (first divider circuit, output clock oscillation device) 43 for dividing the reference clock signal CL1 of the crystal oscillator 41. In the divider circuit 43, a plurality of dividers that include a ½ divider circuit 43*a* having a data setting function and functioning as a pace-setting unit are connected in several stages, the reference clock signal CL1 is divided up to 1 Hz, and a 1-Hz clock signal CL0 is output. The clock signal CL0 is externally output as the output of the oscillation unit 40, and is output as a comparison signal CL4 to the comparator circuit 45 (comparator, correction data output device) inside the oscillation unit 40.

The oscillation unit 40 is provided with a divider circuit 44 (second divider circuit, clock signal generation device) 44 for dividing the clock signal CL2 of the atomic oscillator 42, and the divider circuit 44 divides the clock signal CL2 to 1 Hz and outputs the 1-Hz divided signal CL3 to the comparator circuit 45.

Figure 3:
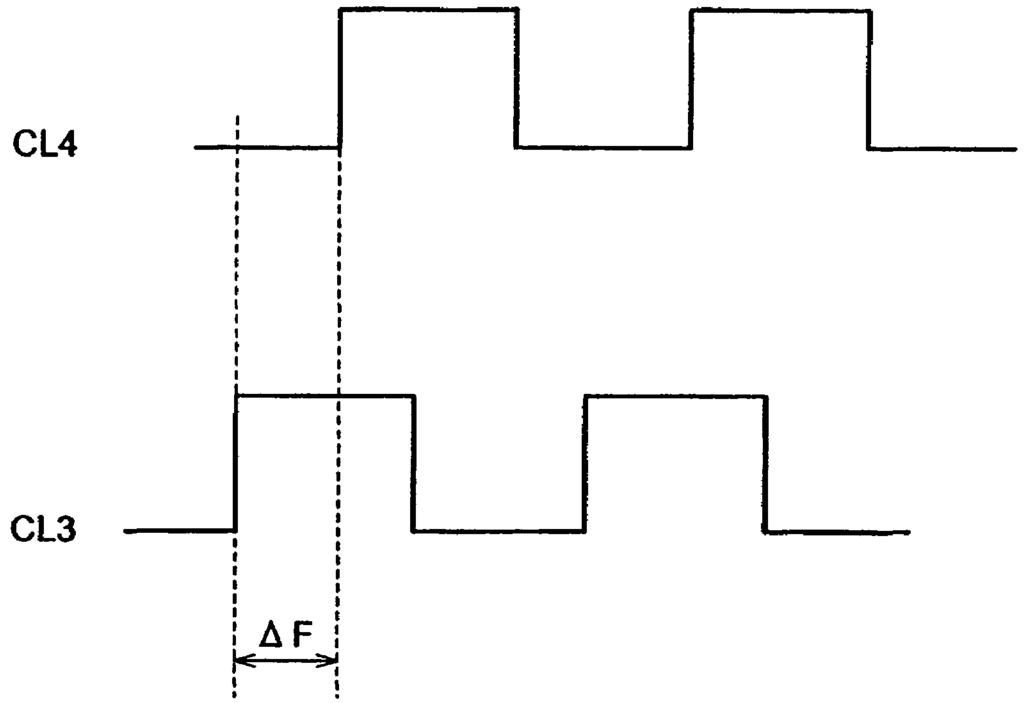

The comparator circuit 45 is a circuit for comparing the phase of the 1-Hz comparison signal CL4, which is a divided signal of the reference clock signal CL1 of the crystal oscillator 41, and the 1-Hz clock signal CL3, which is a divided signal of the clock signal CL2 of the atomic oscillator 42. More specifically, correction data D1 that shows the phase difference ΔF of the comparison signal CL4 with respect to the clock signal CL3 is output to the correction unit 46 by measuring the rise timing of the comparison signal CL4 and the clock signal CL3 with the aid of the divided signal (a clock signal acquired from any of the divided stages of the divider circuit 44, a 100-Hz signal, for example) of the atomic oscillator 42, as shown in FIG. 3.

The phase difference ΔF between the comparison signal CL4 and clock signal CL3 can be measured by using the 9.2 GHz clock signal CL2 of the atomic oscillator 42. To reduce power consumption, the circuit network having high-frequency components is preferably reduced by measuring the difference with the aid of the divided signal of the clock signal CL2 of the atomic oscillator 42. Also, the comparison signal CL4 that is input to the comparator circuit 45 is not required to be equal to the whole cycle of the output clock signal and may have a frequency that is an intermediate frequency of the divided cycle as long as the design frequency is the same as the frequency of the divided signal CL3. This frequency may, for example, be 16 Hz.

Figure 4:
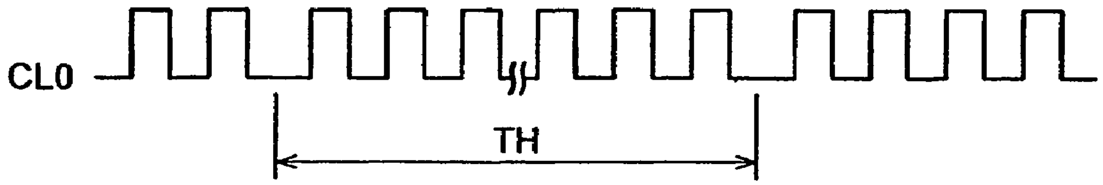

The correction unit 46 is a circuit for correcting the clock signal CL0 on the basis of the correction data D1 acquired from the comparator circuit 45. The unit has a memory 46*a* (storage unit) for storing correction data D1 and the like, and also has a pacing logic circuit (pacing logic device) 46*b* for sending, on the basis of the correction data D1 stored in the memory 46*a*, a pacing signal T1 to the ½ divider circuit 43*a* that has a data-setting function, and pacing and actuating the ½ divider circuit, as show in FIG. 2. The pacing logic circuit 46*b* increases or decreases the clock signal CL0 each correction cycle (10 seconds) TH by an amount equal to the required phase difference (pace) by pacing and actuating the ½ divider circuit 43*a* having a data-setting function, as shown in FIG. 4. The phase of the clock signal CL0 is corrected by an amount equal to the phase offset (equivalent to the phase difference ΔF) with respect to the clock signal CL2.

The atomic oscillator 42 has excellent short-term precision (precision of the oscillation frequency affected by temperature variation) and long-term stability (precision affected by aging or the like) in comparison with the crystal oscillator 41, but since power consumption is considerably higher than that of the crystal oscillator 41, the continuous operating time of the battery 60 is shortened when the atomic oscillator 42 is constantly driven.

In view of the above, in the present embodiment, the oscillation unit 40 is provided with a intermittent time management unit (intermittent drive unit, intermittent drive device) 47, as shown in FIG. 2, and the intermittent time management unit 47 is configured to intermittently drive the atomic oscillator 42 with allotted time intervals of non-driving.

The intermittent time management unit 47 is provided with a counter (counter device) 47*a* for counting the clock signals (for example, clock signals having a prescribed frequency in the divider circuit 43 (may be 1-Hz clock signals CL0)) of the crystal oscillator 41. Each time the count value of the counter 47*a* reaches a value that corresponds to the drive stop time period (three hours, for example), power is fed from the power supply unit 13 to the intermittently driven unit 49 that is composed of the atomic oscillator 42, divider circuit 44, and comparator circuit 45. The power is supplied only during the drive time period (10 seconds, for example). The intermittently driven unit 49 is thereby driven for only 10 seconds every three hours. It is only during this driving interval that correction data D1 (which shows the phase difference ΔF between the divided signal (the 1-Hz clock signal CL3) of the atomic oscillator 42 and the divided signal (1-Hz comparison signal CL4) of the crystal oscillator 41) is output from the comparator circuit 45. When the correction data D1 is acquired in the correction unit 46, the previous correction data D1 is updated to the new correction data D1, and the phase of the clock signal CL0 is corrected on the basis of the updated correction data D1.

Figure 5:
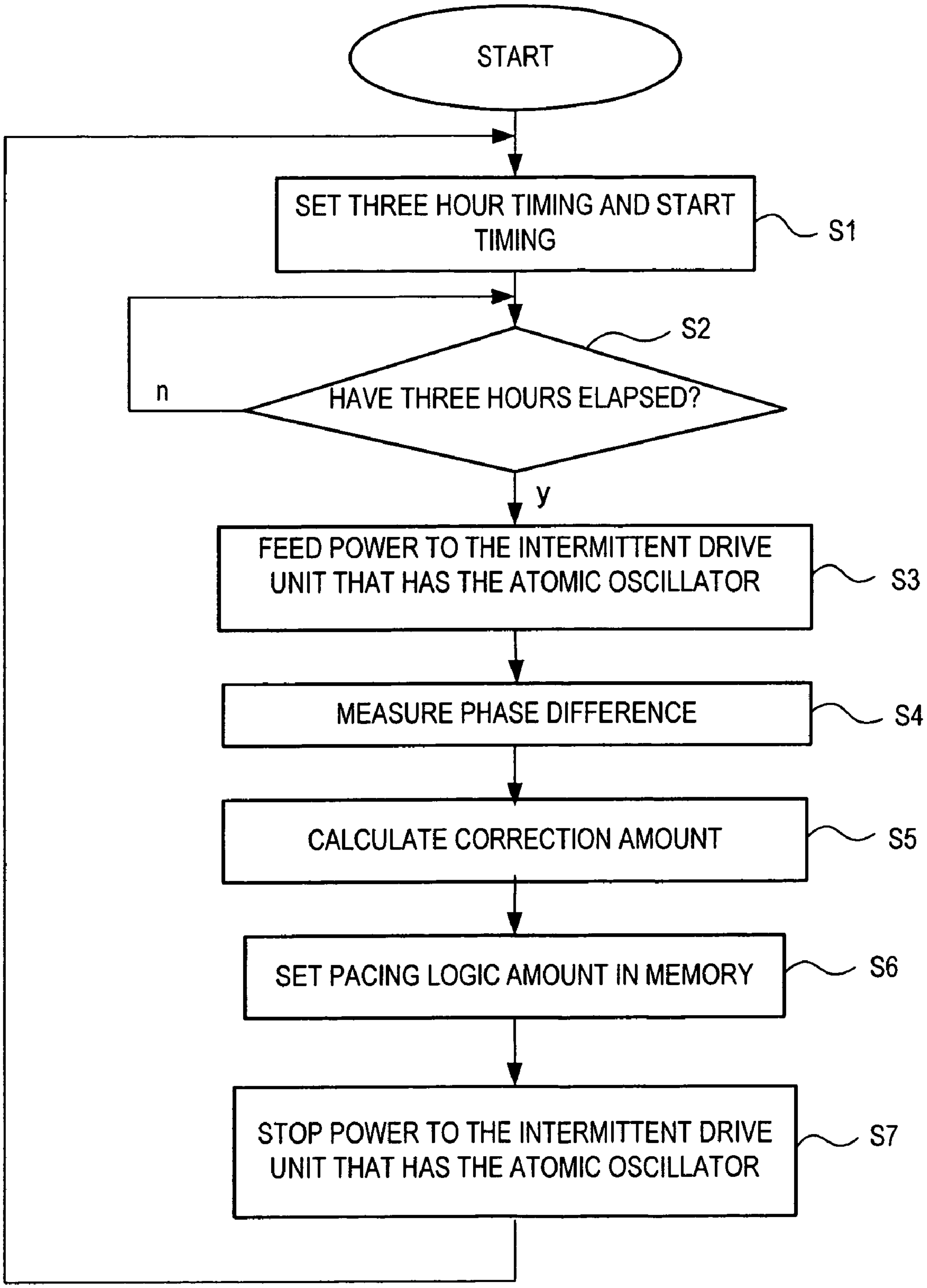

FIG. 5 is a flowchart showing the operation of the oscillation unit 40.

In the oscillation unit 40, the intermittent time management unit 47 resets the counter 47*a* to start timing (step S1) and determines, on the basis of the count value of the counter 47*a*, whether the drive stop time period (three hours) has passed (step S2). The intermittent time management unit 47 repeats the determination of step S2 until the drive stop time period (three hours) has elapsed (step S2: n). If it has been determined that the drive stop time period (three hours) has elapsed (step S2: y), power is fed to the intermittently driven unit 49 that includes the atomic oscillator 42, and the oscillation of the atomic oscillator 42 is started (step S3).

After the oscillation frequency of the atomic oscillator 42 has subsequently stabilized, the comparator circuit 45 measures (step S4) the phase difference ΔF between the divided signal (the 1-Hz clock signal CL3) of the atomic oscillator 42 and the divided signal (1-Hz comparison signal CL4) of the crystal oscillator 41), and outputs the correction data D1 to the comparator circuit 46. The correction unit 46 stores the correction data D1 in a prescribed area of the memory 46*a*, updates the correction data to the newly acquired correction data D1 when previous correction data D1 is present, and calculates the correction amount (pacing logic amount) on the basis of the correction data D1 (step S5).

Next, the correction unit 46 stores the correction amount (pacing logic amount) in a prescribed area of the memory 46*a*, and the pacing logic circuit 46*b* performs a routine for pacing and actuating, on the basis of the correction amount, the ½ divider circuit 43*a* having a data-setting function (step S6), and correcting the phase offset amount of the 1-Hz clock signal CL0 (comparison signal CL4). The intermittent drive unit 47 stops the supply of power when the drive time period (10 seconds) has passed after the start of the supply of power to the intermittently driven unit 49 that contains the atomic oscillator 42, the operation of the intermittently driven unit 49 is stopped, and the process moves to step S1 (step S7). Based on the correction amount (pacing logic amount) stored in the memory 46*a*, the phase offset amount of the 1-Hz clock signal CL0 is thereby corrected while the intermittently driven unit 49 is stopped, and after three hours have elapsed, the process is repeated in which the phase difference ΔF between the divided signal of the atomic oscillator 42 and the divided signal of the crystal oscillator 41 is newly measured when the intermittently driven unit 49 is driven again, and in which the phase offset amount of the 1-Hz clock signal CL0 is corrected so as to correct the phase difference ΔF.

In the present configuration, the crystal oscillator 41 is constantly driven and the atomic oscillator 42 is intermittently driven while the wristwatch 1 is driven, the phase offset amount of the 1-Hz comparison signal CL4 (which is a divided signal of the crystal oscillator 41) is measured based on the clock signal CL2 of the atomic oscillator 42 each time the atomic oscillator 42 is driven, and the 1-Hz clock signal CL0 is corrected so that the phase offset amount is corrected. Therefore, the atomic oscillator 42 can be intermittently stopped, the precision of the clock signal CL0 can be increased based on the atomic oscillator 42, and time error can be reduced while avoiding an increase in the overall power consumption.

Figure 6:
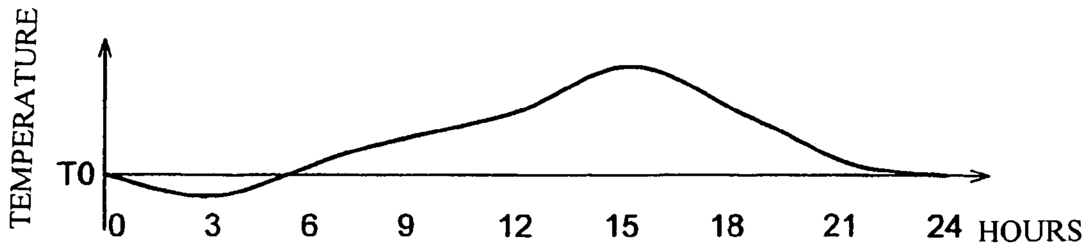
FIG. 6(A) is a diagram showing the temperature change of a single day.
FIG. 6(B) is a diagram shown the frequency precision of a crystal oscillator prior to correction.
FIG. 6(C) is a diagram showing the frequency precision after correction.
Figure 6:
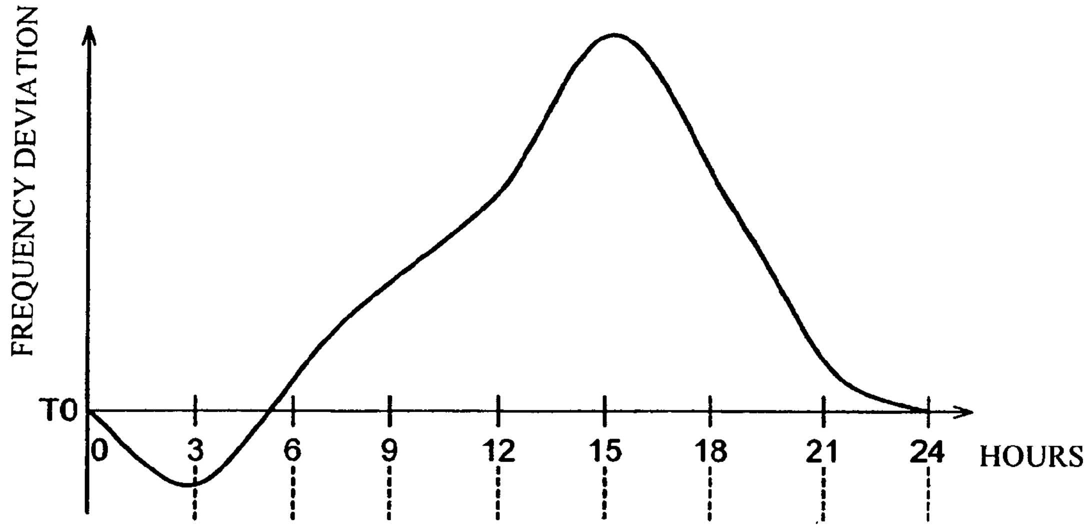
Figure 6:
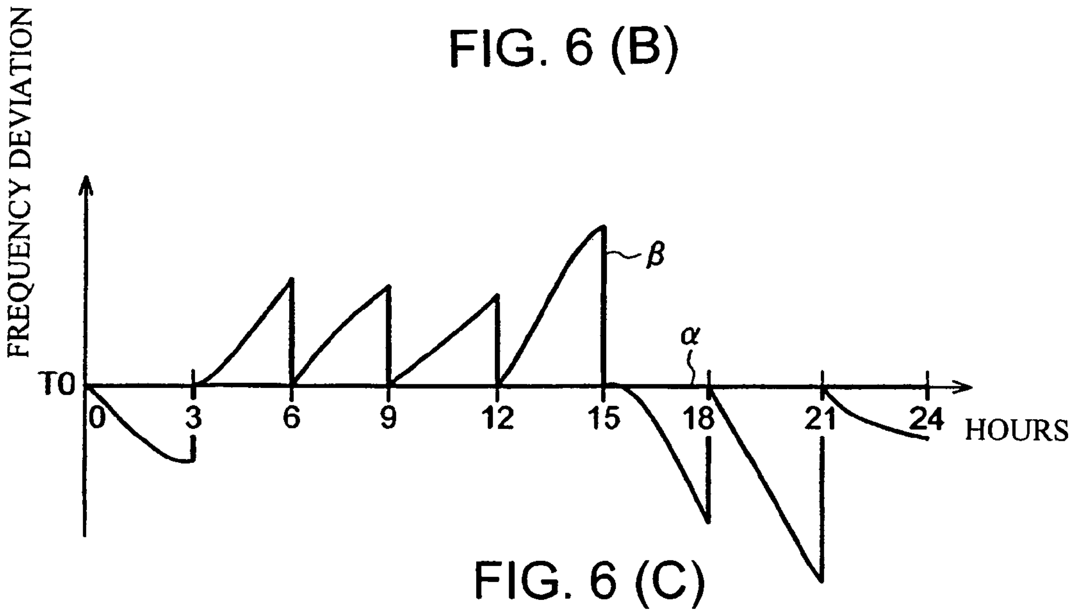

More specifically, when the temperature over a single day varies as shown in FIG. 6(A), the frequency deviation of the crystal oscillator 41 prior to correction is on the minus side during the daytime hours when the temperature is lower than the reference temperature (25° C., for example), and the frequency deviation is on the plus side during the nighttime hours when the temperature is higher than the reference temperature T0, as shown in FIG. 6(B). In the present configuration, since the crystal oscillator 41 is corrected by the precision of the atomic oscillator 42 every three hours, the absolute value of the frequency deviation is reduced, as shown in FIG. 6(C).

In FIG. 6(C), the area enclosed by the reference temperature T0 (reference symbol α in the diagram) and the frequency deviation line (reference symbol β in the diagram) corresponds to the clock error per day (daily error). In the present embodiment, the error is corrected to the precision of the atomic oscillator 42 in cycles (three hours) that are shorter than the daytime interval in which the temperature is relatively high or the nighttime interval in which the temperature is relatively low in a single day. Therefore, the frequency offset on the plus side during daytime hours and frequency offset on the minus side during nighttime hours can be mutually offset, and the daily, monthly, and annual errors of the wristwatch 10 can be reduced. When the frequency deviation that depends on the temperature characteristics of the crystal oscillator 41 is, for example, 0.1 ppm, the frequency deviation can be can be kept to about ⅛, that is, about 0.0125 ppm (equal to an annual error of about 0.4 second), by correcting the error eight times in a single day. When the power consumption of the atomic oscillator 42 is 0.1 W, the power consumed by the atomic oscillator 42 can be kept to 10/10,800, that is, a power consumption ($10^{-4}$ W) of about 1/1000, because the atomic oscillator 42 is operated for 10 seconds per three hours (10,800 seconds).

Figure 7:
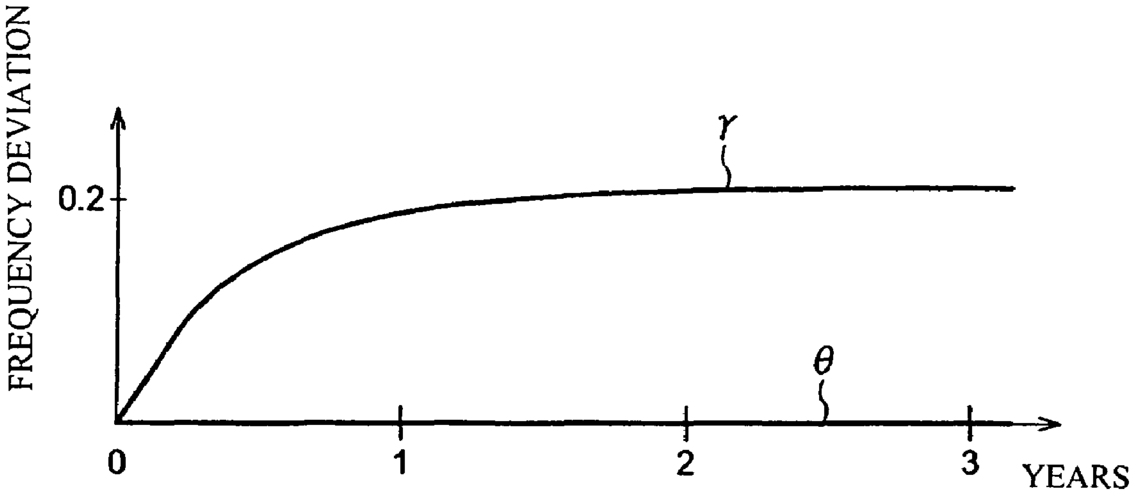
FIG. 7 A diagram used to describe long-term precision of a crystal oscillator FIG. 8 A block diagram showing the configuration of the wristwatch of the second embodiment FIG. 9 A diagram describing the driving stop time of an atomic oscillator FIG. 10 A flowchart showing the operation of the oscillation unit FIG. 11 A block diagram showing the configuration of the wristwatch of the third embodiment FIG. 12 A diagram showing correction data FIG. 13 A flowchart showing the operation of the oscillation unit FIG. 14 A block diagram showing a configuration example of the oscillation unit of a modified example FIG. 15 A diagram showing a configuration example of a crystal oscillator FIG. 16 A diagram showing a clock signal after correction

When the frequency deviation that depends on the aging characteristics of the crystal is 0.2 ppm over three years (reference symbol γ in the diagram), as shown in FIG. 7, the precision can be set to about $10^{-4}$ ppm, which is the same frequency deviation as the precision of the atomic oscillator 42 (reference symbol θ in the diagram). This is because the error can be corrected in the present embodiment to an amount that is about the same as the long-term frequency deviation of the atomic oscillator 42, and a high quality wristwatch 10 can be provided whose error does not fluctuate over a long period of time from the start of use. Furthermore, in the present configuration, not only is the atomic oscillator 42 stopped, but the divider circuit 44 and comparator circuit 45 are also intermittently stopped, so power consumption can be further reduced by an equivalent amount, and the continuous operating time of the battery is not considerably reduced even if the same battery as that used in a conventional wristwatch is employed. Thus, in the present embodiment, since the clock error can be reduced over a long period of time while avoiding an increase in power consumption, the wristwatch 1 can be adequately used as railroad clocks that require precision and are used by subway and other railroad station personnel and train operators.

Embodiment 2

Figure 8:
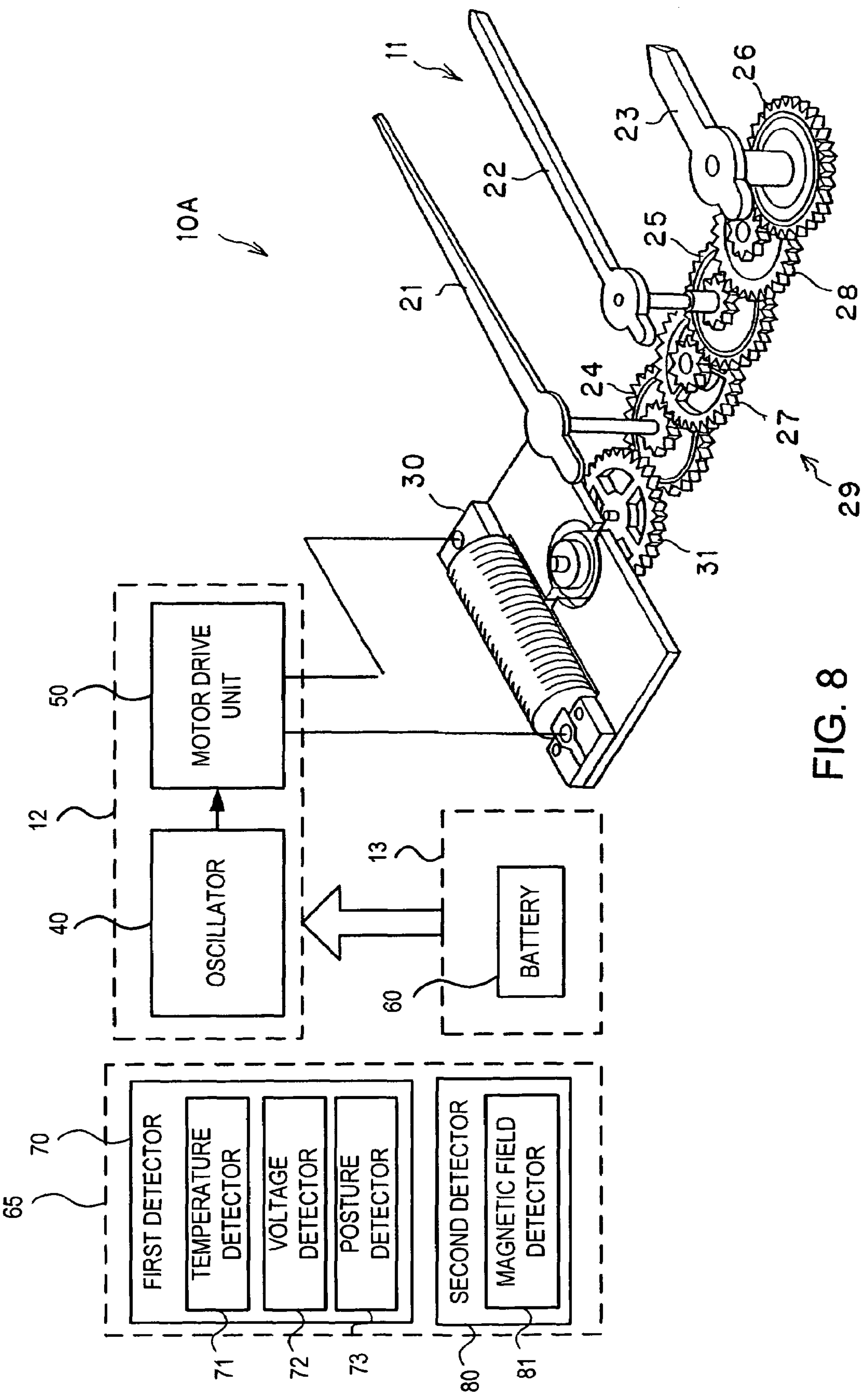

The wristwatch 10A of the second embodiment is provided with a sensor 65 (reference oscillator effect information detector), as shown in FIG. 8. The sensor 65 has a first detector (reference oscillator effect information detector) 70 for detecting first information (reference oscillator effect information) that affects the operation of the crystal oscillator (reference oscillator) 41 and other components, and a second detector (high-precision oscillator effect information detector) 80 for detecting second information (high-precision oscillator effect information) that affects the operation of the atomic oscillator (high-precision oscillator) 42 and other components. Configurations that are substantially the same as the first embodiment are assigned the same reference numerals and are omitted from the detailed description, and differing portions will be described in detail.

The first detector 70 is provided with a temperature detector 71 for detecting temperature (including outside temperature), a voltage detector 72 for detecting power-supply voltage, and a posture detector 73 for detecting the posture of the wristwatch 10A. Here, temperature variation is a factor that leads to frequency variation of the crystal oscillator 41; a reduction in the power-supply voltage is a factor that leads to unstable operation of the components of the wristwatch 10A;

and the posture of the wristwatch 10A is a factor that leads to frequency variation and the like of the crystal oscillator 41 (an posture or the like that affects the mechanical vibrations of the crystal, for example).

The second detector 80 is provided with a magnetic detector 81 for detecting earth magnetism and other magnetic fields (variable magnetic flux), which are factors that lead to unstable operation of the atomic oscillator 42 when a tolerance level is exceeded.

Figure 9:
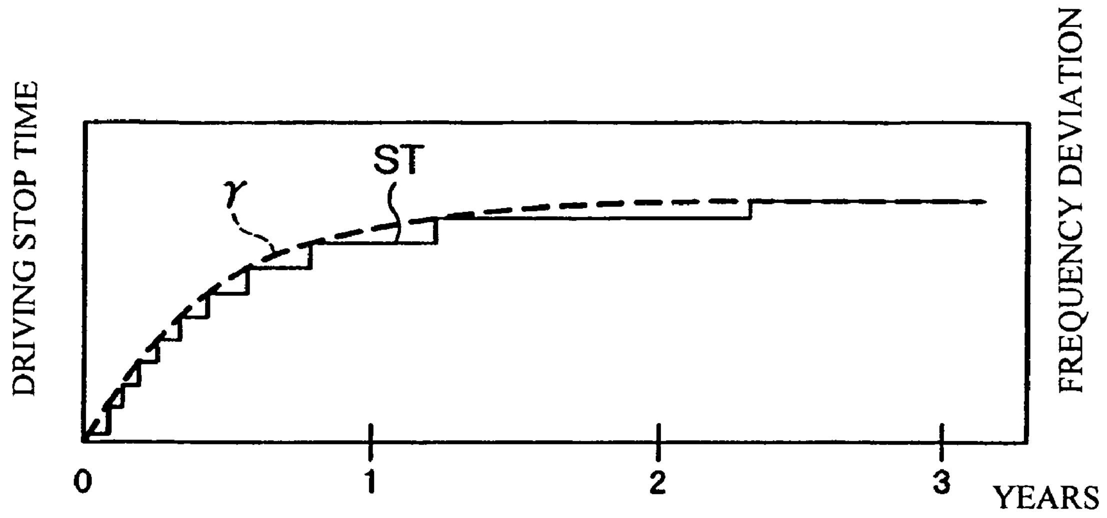

In the present embodiment, the intermittent time management unit 47 inside the oscillation unit 40 sets the drive stop time ST of the atomic oscillator 42 in accordance with the aging characteristics γ of the crystal, as shown in FIG. 9. More specifically, since the aging characteristics γ of the crystal are characteristics that vary logarithmically, as shown in the same diagram, the intermittent time management unit 47 sets the shortest drive stop time immediately after the start of use of the wristwatch 10 by logarithmically varying the drive stop time ST of the atomic oscillator 42, and extends the drive stop time in a stepwise fashion in accordance with the passage of time. In the example in the diagram, the case is shown in which the drive stop time ST is changed each time the frequency deviation of the crystal varies by a fixed amount, but the drive stop time ST may be changed or the change timing may be arbitrarily set each time a fixed amount of time elapses.

In the wristwatch 10A, the oscillation unit 40 drives the atomic oscillator 42 on the basis of the drive stop time ST that was set by the intermittent time management unit 47, a periodic correction procedure is carried out to correct the clock of the crystal oscillator 41, and a provisional correction procedure is additionally carried out to correct or stop correcting the clock of the crystal oscillator 41 on the basis of the detection result of the sensor 65.

Figure 10:
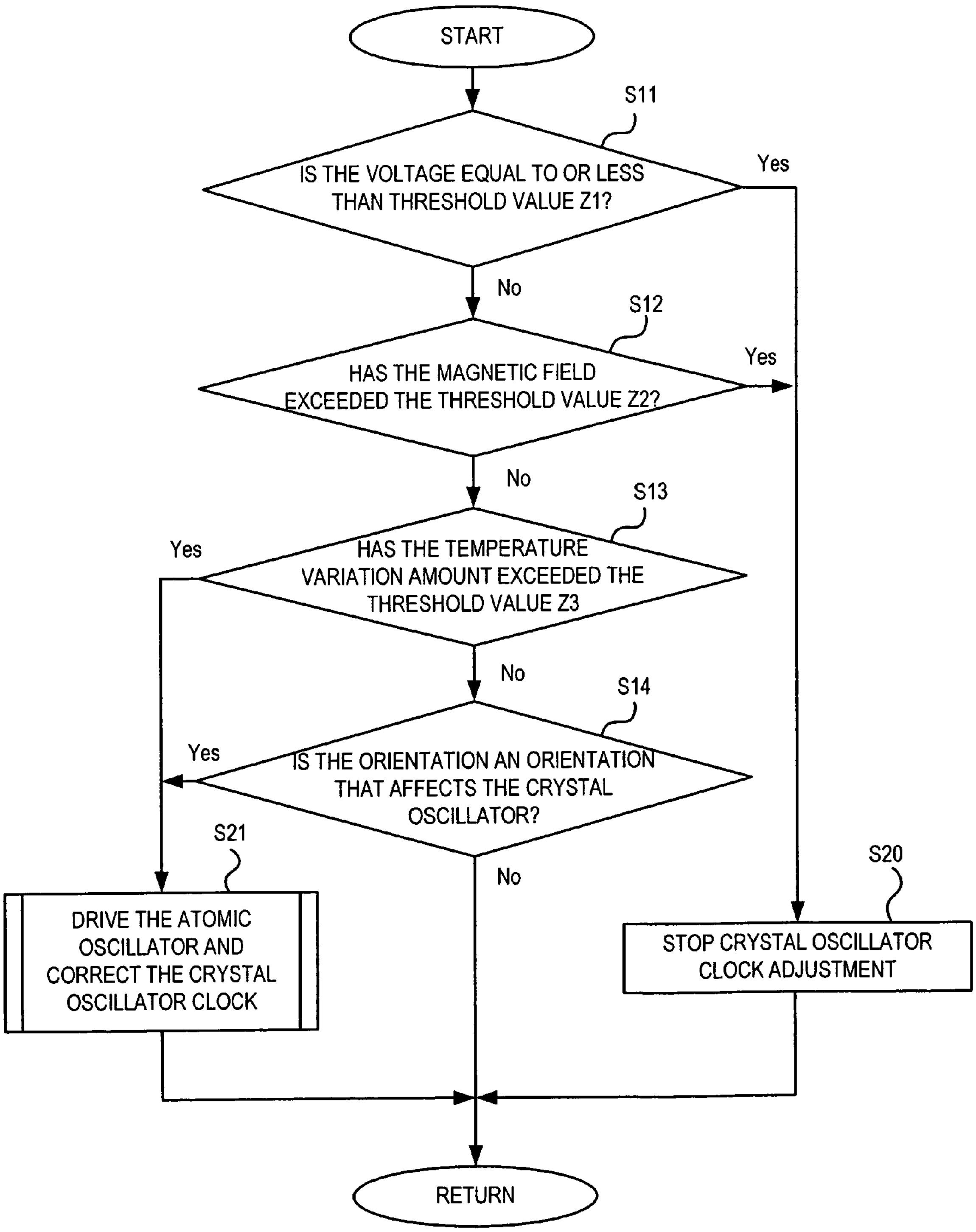

This provisional correction procedure is described hereinbelow. FIG. 10 is a flowchart showing the corresponding operation. This provisional correction procedure is a procedure that is intermittently executed at prescribed interrupt cycles.

In the oscillation unit 40, the intermittent time management unit 47 first determines whether the voltage detected by the voltage detector 72 is equal to or less than a preset threshold value Z1 (step S11). Here, the determination reference value that indicates whether the remaining battery power is low is used as the threshold value Z1.

If the voltage is equal to or lower than the threshold value Z1 (step S11: YES), the intermittent time management unit 47 sets the clock correction of the crystal oscillator 41 in a stopped state to avoid consuming power required to drive the atomic oscillator 42 and to carry out other operations (step S20). When set to this stopped state, the oscillation unit 40 does not drive the atomic oscillator 42 and does not perform clock correction even if the drive stop time ST has elapsed. Power consumption can thereby be reduced and the drive time of the wristwatch 10A can be assured. The setting of this stopped state is released when the voltage exceeds the threshold value Z1.

If the voltage exceeds the threshold value Z1 (step S11: NO), the intermittent time management unit 47 determines whether the magnetic field detected by the magnetic detector 81 exceeds a preset threshold value Z2 (step S12). If the voltage also exceeds the threshold value Z2 (step S12: YES), the process moves to step S20 and clock correction is set to a stopped state. Here, the tolerance level of the magnetic field with respect to the atomic oscillator 42 is used as the threshold value Z2, and situations can thereby be avoided in which the atomic oscillator 42 ends up being driven when a magnetic field is at a level that leads to operational instability of the atomic oscillator 42 occurs.

If the magnetic field subsequently exceeds the threshold value Z2 (step S12: NO), the intermittent time management unit 47 determines whether the temperature variation amount detected by the temperature detector 71 exceeds a preset threshold value Z3 (step S13). If the value is exceeded (step S13: YES), the intermittently driven unit 49 that contains the atomic oscillator 42 is driven and the procedure of steps S3 to S7 (hereinafter referred to as the clock correction procedure) for correcting the clock signal CL0 from the crystal oscillator 41 (step S21) is carried out. Here, the tolerance level of the frequency variation that depends on the temperature of the crystal oscillator 41 is used as the threshold value Z3, the clock correction procedure is thereby executed in the case that frequency variation exceeds the tolerance level, and the frequency offset of the clock signal CL0 caused by frequency variation that accompanies the temperature variation of the crystal oscillator 41 can be rapidly avoided.

When the temperature variation amount is equal to or less than the threshold value Z3 (step S13: NO), the intermittent time management unit 47 determines whether the posture detected by the posture detector 73 affects the frequency variation or the like of the crystal oscillator 41 (step S14). If the posture is one that has an effect (step S14: YES), the clock correction procedure of the step S21 is executed. The frequency offset of the clock signal CL0 caused by frequency variation that accompanies the posture variation of the crystal oscillator 41 can thereby be rapidly avoided. Conversely, when the determination result of step S14 is NO, the intermittent time management unit 47 repeatedly executes the procedure after the procedure is temporarily ended.

As described above with reference to the present configuration, information that affects the operation of the crystal oscillator 41 and atomic oscillator 42 is monitored. The clock correction procedure is carried out if information (temperature variation amount, posture) that leads to frequency variation in the crystal oscillator 41 is detected. The clock correction is stopped if information (power supply power, magnetic field) that leads to unstable operation of the crystal oscillator 41 and atomic oscillator 42 is detected. Therefore, the clock signal CL0 can be rapidly corrected in accordance with the frequency variation of the crystal oscillator 41, and time error can be further reduced in comparison with the first embodiment.

Another feature of the present configuration is that since the drive stop time ST of the atomic oscillator 42 is extended in a stepwise fashion in accordance with the aging characteristics γ of the crystal, the clock correction procedure is carried out in relatively short cycles during the first half of the time period (substantially within half a year from the start of use shown in FIG. 9) in which the frequency variation of the crystal oscillator 41 due to aging is considerable, but since the clock correction procedure is carried out in long cycles during the second half of the time period (substantially the latter half year shown in FIG. 9) in which the aging-induced frequency variation is low, the number of times that the atomic oscillator 42 and other components are driven can be reduced while suppressing the frequency variation caused by aging, and power consumption can be reduced. Time error can thereby be further reduced in comparison with the first embodiment, and lower power consumption can be assured.

Embodiment 3

Figures 11, 12:
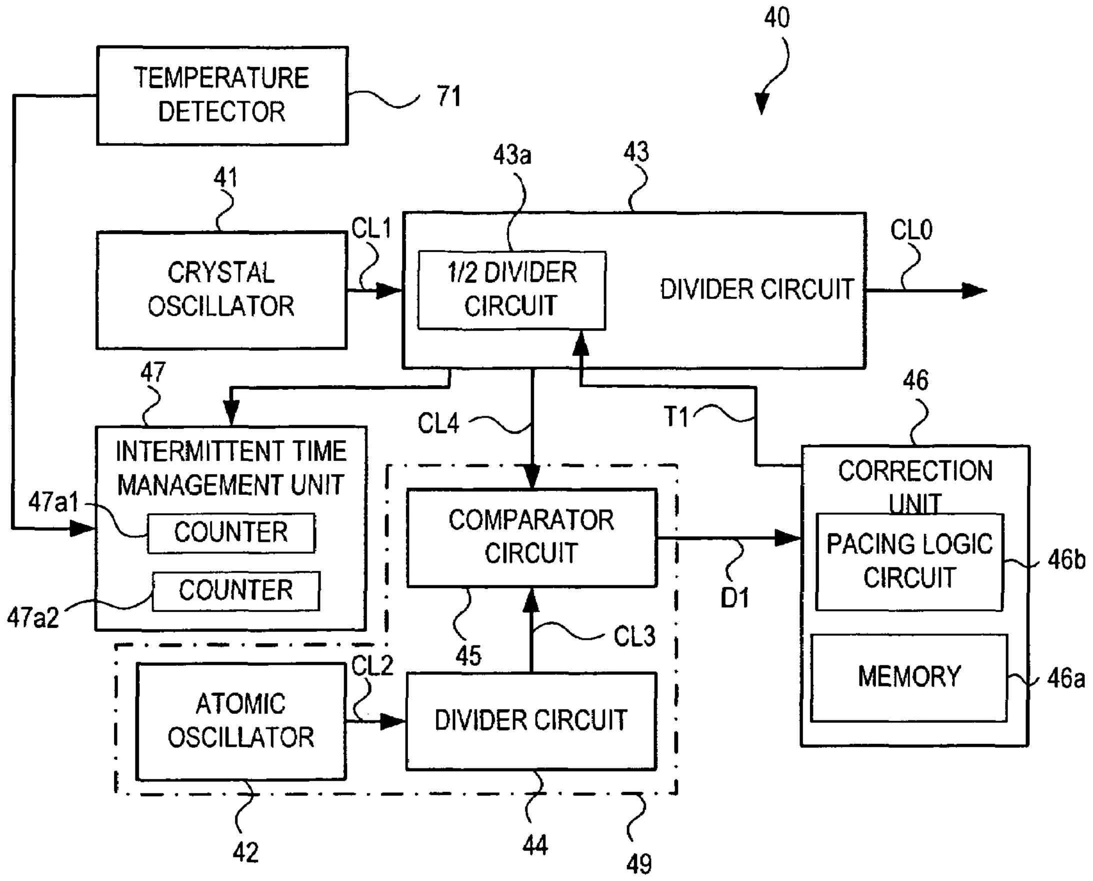

The wristwatch 10B of the third embodiment is provided with a temperature detector 71 for detecting temperature (reference oscillator effect information), as shown in FIG. 11. The temperature detector 71 is connected to the intermittent time management unit 47 of the oscillation unit 40. The intermittent time management unit 47 is provided with a counter 47*a*1 for timing the update time period P1 of the correction data, and a counter 47*b*2 for timing the temperature detection interval P2. The unit is configured to be capable of timing the update time period P1 and temperature detection interval P2.

Correction data D1(k) (k=temperature) that corresponds to temperatures is stored in memory 46*a*, as shown in FIG. 12. Shown in the diagram is a case in which correction data D1(k) is set in increments of 1 degree, but less precise intervals such as 5 degree intervals, for example, may also be set in order to reduce the amount of data. In this case, the correction data D1(n) of an intermediate temperature for which correction data is not set can be specified by using a supplementary calculation procedure or the like to perform calculations based on the correction data D1(m), D1(m+1) (wherein m<n<m+1) for the adjacent temperatures. It is also possible to set the intervals in increments of, for example, 0.5 degrees in order to obtain improved precision.

Figure 13:
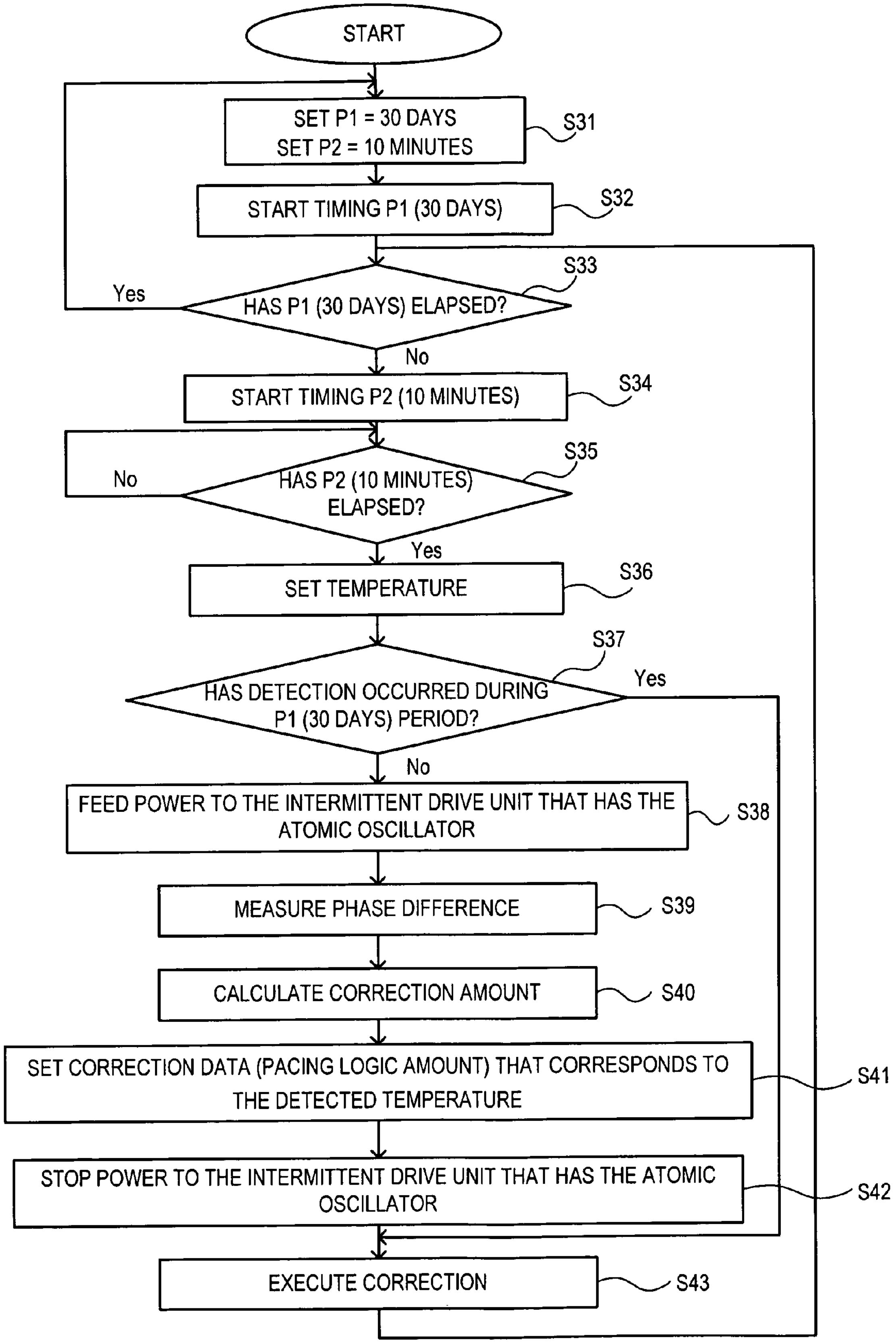

FIG. 13 is a flowchart showing the operation of the oscillation unit 40.

First, the intermittent time management unit 47 sets the update time period P1 of the correction data D1(k) to 30 days, sets the temperature detection interval P2 to 10 minutes (step S31), starts timing the update time period P1 by using the counter 47*a*1 (step S32), and determines whether the update time period P1 has elapsed (step S33).

The intermittent time management unit 47 restarts the timing of the update time period P1 when the update time period P1 has elapsed (step S33: YES), starts timing the temperature detection interval P2 of the temperature detector by using the counter 47*a*2 (step S34) if the update time period P1 has not elapsed (step S33: NO), and waits until the temperature detection interval P2 elapses (step S35).

When the temperature detection interval P2 has elapsed (step S35: YES), the intermittent time management unit 47 measures the temperature T by using the temperature detector 71 (step S36), and determines whether the measured temperature T is the temperature initially detected during the timing of the update time period P1 (step S37).

If the temperature is the initially detected temperature (step S37: NO), the intermittent time management unit 47 feeds power to the intermittently driven unit 49 that contains the atomic oscillator 42, and starts the vibration of the atomic oscillator 42 (step S38). When the atomic oscillator 42 has stabilized, the intermittent time management unit 47 subsequently measures the phase difference ΔF between the divided signal (the 1-Hz clock signal CL3) of the atomic oscillator 42 and the divided signal (the 1-Hz comparison signal CL4) of the crystal oscillator 41 by using the comparator circuit 45 (step S39), calculates the correction amount that is used to correct the phase difference ΔF (step S40), rewrites the correction data D1(T) that corresponds to the measured temperature T stored in the memory 46*a* to correction data that corresponds to the calculated correction amount (step S41), and stops feeding power to the intermittently driven unit 49 to stop the operation of the intermittently driven unit 49 (step S42).

The intermittent time management unit 47 executes a routine for correcting the phase offset amount of the clock signal CL0 on the basis of the rewritten correction data D1(T) (step S43), the procedure of step S33 is then carried out, and the procedures of steps S33 to S43 are repeatedly carried out.

If the measured temperature T is not the temperature that was initially detected during the timing of the current update time period P1 (step S37: YES), the procedure for correcting the phase offset amount of the clock signal CL0 is executed on the basis of the correction data D1(T) that corresponds to the measured temperature T stored in the memory 46*a* (step S43), the procedure of step S33 is then carried out, and the procedures of steps S33 to S43 are repeatedly carried out.

Therefore, only when the temperature T is measured in the temperature detection interval P2 and the temperature T is the temperature initially detected during the timing of the update time period P1, the intermittently driven unit 49 that contains the atomic oscillator 42 is driven and correction data D1(T) that corresponds to the measured temperature T is obtained, allowing the correction data D1(k) in the memory 46*a* to be updated to the most recent value. Therefore, even if the frequency with respect to the temperature of the crystal oscillator 41 fluctuates due to aging or other factors, the correction data D1(k) in the memory 46*a* can be updated in accordance with the fluctuation, and the frequency offset of the clock signal CL0 can be avoided.

As described above in relation to the present configuration, the number of times the high-precision oscillator is driven can be reduced and power consumption can be lowered in comparison with the first embodiment, in which power is fed to the intermittently driven unit 49 at preset intervals to acquire correction data. The reason for this is that power is fed to the intermittently driven unit 49 that contains the atomic oscillator 42, the correction data D1(T) that corresponds to the temperature T is obtained, and the correction data in the memory 46*a* is updated only when the measured temperature T is the value initially detected during the preset update time period P1. Time error can thereby be further reduced in comparison with the first embodiment, and lower power consumption can be assured.

Also, when the update time period P1 elapses, the correction data in the memory 46*a* can be suitably updated in accordance with the frequency fluctuation caused by the aging characteristics and other aspects of the crystal, and time error can be further reduced because correction data D1(T) corresponding to the temperature T is obtained and the correction data in the memory 46*a* is updated for each temperature T that is initially detected in the subsequent update time period P1.

In accordance with the present embodiment, the adjustment system and the temperature compensation system of the crystal oscillator 41 are internally mounted. Therefore, high cost adjustment devices and adjustment work are not required for adjustment at the time of factory shipment. Even when the frequency of driving the atomic oscillator 42 is reduced to extend the life of the battery after adjustment has been performed at the time of factory shipment and the device has been shipped, adjustment can be completed by exposing the device to a required temperature (−20° C. to 70° C., for example) by using a high-temperature container or the like at the time of factory shipping, and shorter and simplified adjustment procedures can be assured.

This aspect is not limited to the case in which the update time period P1 is fixed, and the update time period P1 may be variable, or more preferably, the update time period P1 may be extended in a stepwise fashion in accordance with the aging characteristics γ of the crystal (see FIG. 9). If the update time period P1 is varied in accordance with the aging characteristics γ, the number of times that the atomic oscillator 42 and other components are driven can be reduced while the aging-induced frequency variation is suppressed, and the power consumption can be even further lowered. According to the present configuration, it is possible to thereby provide an oscillator whose overall precision approaches the precision of an atomic oscillator and whose power consumption is approximate to the power consumption of a crystal oscillator.

The above-described embodiments describe one mode of the present invention, but it is possible to make any modification that is within the range of the present invention. In the second and third embodiments, for example, a case was described in which the temperature variation amount and posture are detected as information that leads to frequency variation in the crystal oscillator 41, but no limitation is imposed thereby, and the humidity variation amount, for example, may be detected, or the gravitational direction may be detected in place of posture detection. Also, information that leads to operational instability of the crystal oscillator 41 and atomic oscillator 42 is not limited to power-supply voltage and magnetic fields, and other information may be used. In the third embodiment, it is possible to have a configuration in which a second detector 80 is provided for detecting second information that affects the operation of the atomic oscillator 42 and other components, and the atomic oscillator 42 is not driven and the correction data is not acquired during the interval in which the second detector 80 detects the second information.

The embodiments described above involved a case in which the phases of the crystal oscillator 41 and atomic oscillator 42 are compared, but it is also possible to compare the frequencies of the crystal oscillator 41 and atomic oscillator 42, and to correct the oscillation frequency of the crystal oscillator 41 on the basis of the frequency of the atomic oscillator 42.

Figure 14:
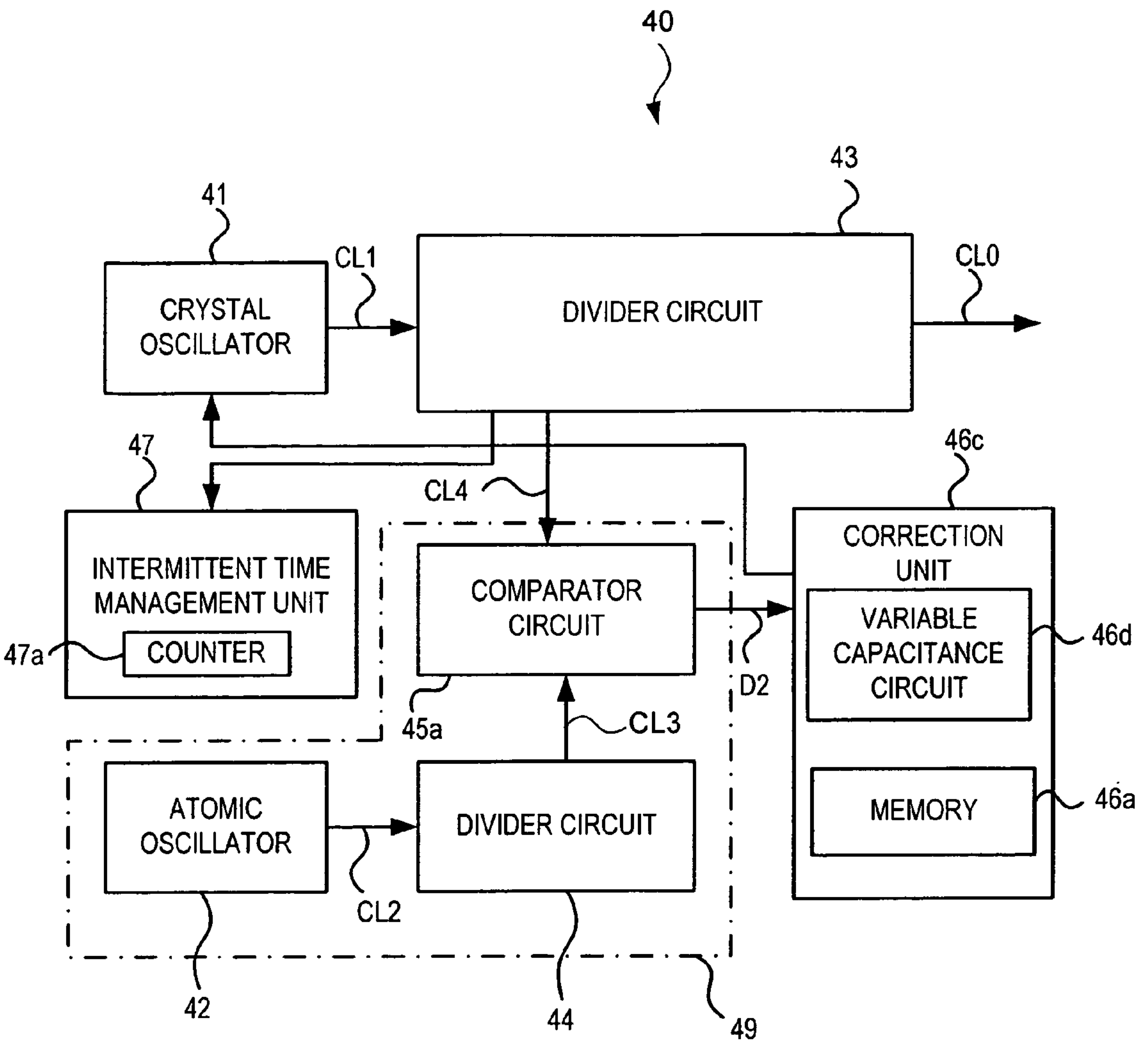
Figure 15:
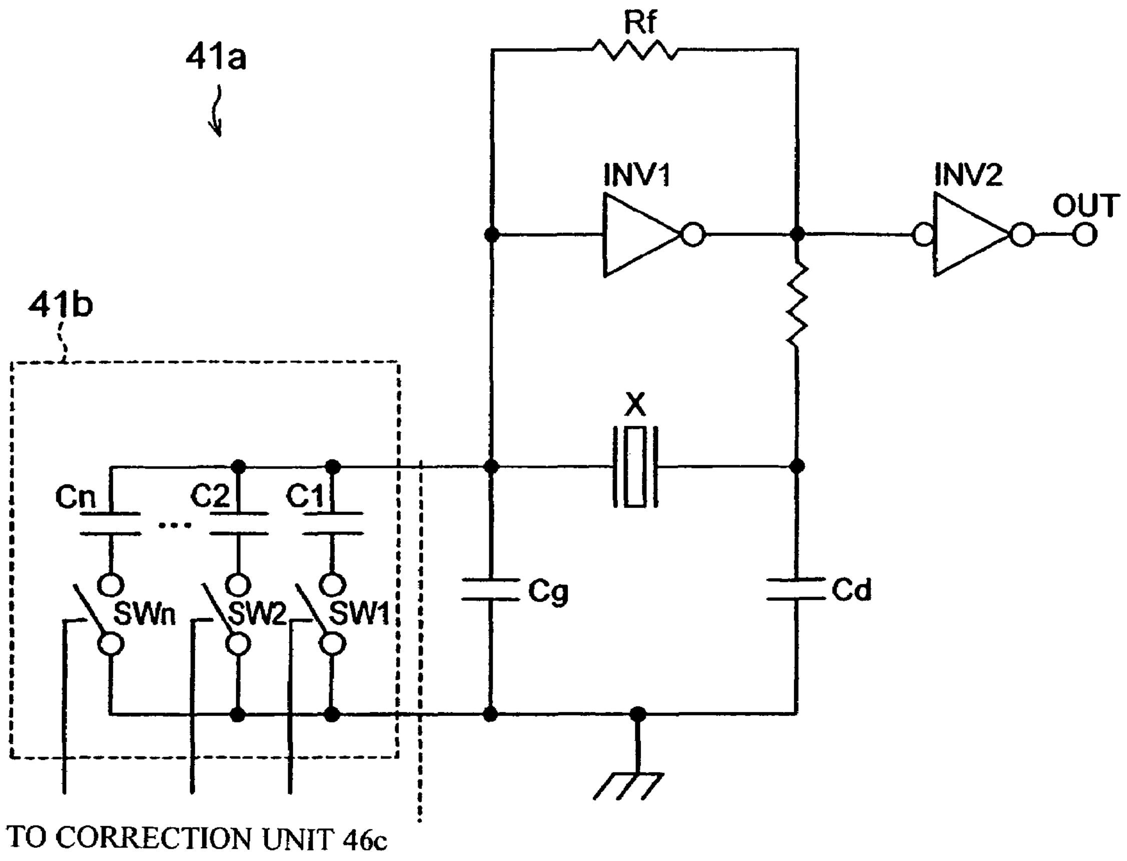

FIG. 14 is a flowchart showing a configurational example of the oscillation unit 40 in a case in which the oscillation frequency is corrected. In the diagram, configurations that are the same as FIG. 1 are assigned the same reference numerals and are omitted from the description. In the oscillation unit 40, the crystal oscillator 41*a* is configured with a crystal oscillator X, an oscillation inverter INV1, a feedback resistor Rf, a drive adjustment resistor Rd, a gate-side capacitor Cg, and a drain-side capacitor Cd, as well as a frequency adjustment unit 41*b* composed of series circuits that are composed of capacitors C1, C2, . . . , Cn and switches SW1, SW2, . . . , SWn and are connected in parallel to the capacitor Cg, as shown by the example in FIG. 15. The correction unit 46*c* is composed of a memory 46*a* and is further provided with a variable capacitance circuit 46*d* that controls the switches SW1 to SWn, as shown in FIG. 14. The only difference of the divider circuit 43*b* is that a ½ divider circuit that does not have a data-setting function is used instead of the ½ divider circuit 43*a* that has a data-setting function.

Figure 16:
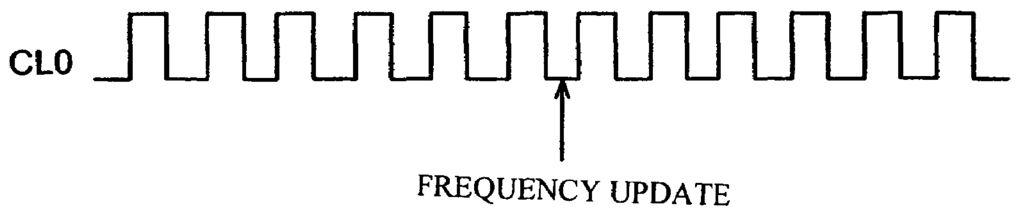

In the oscillation unit 40, the comparator circuit 45*a* measures the cycle of the 1-Hz comparison signal CL4, which is the divided signal of the reference clock signal CL1 of the crystal oscillator 41, with the aid of, for example, a 100-MHz divided signal of the atomic oscillator 42, and outputs the correction data D2 that shows this cycle to the correction unit 46*c*. The correction unit 46*c* calculates the frequency offset amount of the crystal oscillator 41 on the basis of the correction data D2, controls the open/close state of the switches SW1 to SWn in accordance with the frequency offset amount, and maintains the state in which the oscillation frequency of the crystal oscillator 41*a* is changed so that the frequency of the clock signal CL0 (comparison signal CL4) remains at 1 Hz. The oscillation frequency of the crystal oscillator 41*a* is thereby updated to the frequency precision of the atomic oscillator 42 every three hours. In addition to the effects of the above-described embodiments, the oscillation cycles of the clock signal CL0 can be kept substantially constant, as shown in FIG. 16, in comparison with the case (FIG. 4) in which pacing logic is used to correct the clock signal CL0 every correction cycle TH (10 seconds).

In the present embodiment, the pacing logic method described above and the method of varying the capacitance of the crystal oscillator may be jointly used to correct the clock signal CL0. In this case, the adjustment amount of the clock signal CL0 can be increased by jointly using the pacing logic method and the variable capacitance method. The arrangement is not limited to the case in which variable capacitors are provided inside the crystal oscillation circuit, and the variable capacitors may also be provided outside of the crystal oscillation circuit.

Described in the embodiments above was a case in which the phase or the frequency of the reference clock signal CL1 was controlled in order to correct the offset amount of the clock signal CL0, but the arrangement is not limited to the reference clock signal CL1, and the phase or the frequency of another signal (the divider signal, for example) that acts as a generation reference of the clock signal CL0 may be controlled in order to correct the offset amount of the clock signal CL0.

Exemplified in the above-described embodiments is a case in which the drive stop time period of the atomic oscillator 42 and other components is set at three hours and the drive time period is 10 seconds, but no limitation is imposed thereby, and any time period may be used. The intermittent drive cycles are not limited to being equal intervals; and the drive stop time period may, for example, be made short during daytime hours (two hours, for example) and may be made long during the nighttime hours (four hours, for example), and the intermittent drive cycles may be unequal cycles.

Also exemplified in the embodiments described above was a case in which a crystal oscillator was used that had a tuning fork-type crystal oscillator as a reference oscillator, and an atomic oscillator was used as an oscillator (high-precision oscillator) with higher precision than the reference oscillator, but examples of oscillators that may be used as the reference oscillator also include temperature-compensated crystal oscillators and other crystal oscillators, PLL (Phase Locked Loop) circuits, CR oscillators other than crystal oscillators, ceramic oscillators, and MEMS (Micro Electronic Mechanical Systems) oscillators in which the mechanical components, the electronic components, and other components are integrated on a silicon substrate. Examples of other oscillators that may be used as the high-precision oscillator in a range in which the frequency precision or the frequency stability is higher than that of the reference oscillator include an oscillation circuit in which an AT-cut oscillator is used, a temperature-compensated oscillator (TCXO), an oven-controlled Xtal oscillator (OCXO), and the like. However, since the reference oscillator is constantly driven, the oscillator is preferably one in which the oscillation frequency is lower than that of the high-precision oscillator from the viewpoint of reducing power consumption.

Shown in the embodiments described above are examples of the present invention applied to a wristwatch 10 composed of a hand movement mechanism (driven unit) 11, a drive unit 12, and a power supply unit 13, but application may also be widely made to clocks with a calendar mechanism, a radio wave clock that receives radio waves superimposed with a time code and corrects time on the basis of the time code, a pocket clock, a desk clock, a hanging clock, and other clocks in general, or to mobile phones, PDAs (Personal Digital Assistants), portable measuring equipment, portable GPS (Global Positioning System) devices, and other portable electronic equipment, or to standard oscillators, personal notebook computers and other electronic equipment. Because of the reduced power consumption, the present invention is particularly suitable for electronic devices with a built-in power supply that must operate for a long time and that house a power supply (battery) for feeding operating power.

When applied to a radio wave clock, a sufficiently accurate time can be displayed even when, for example, radio waves cannot be received in locations with poor reception (inside buildings, underground, in water, near a noise source), locations in which radio waves are not present (in space, locations without a standard time signal station, and the like), during periodic radio wave inspection, when the radio wave frequency and time code are different, when the electric field intensity is reduced due to meteorological conditions, or in other situations. A highly precise radio wave clock can be provided in such a variety of situations. When applied to mobile phones or other data communication equipment, highly reliable and high speed communication can be carried out by using the clock signal from the oscillation unit 40 as a reference signal that determines the communication bit rate.

The terms "front," "back, "up," "down," "perpendicular," "horizontal," "diagonal," and other direction-related terms used above indicate the directions in the diagrams used herein. Therefore, the direction-related terms used to describe the present invention should be interpreted in relative terms as applied to the diagrams used.

"Substantially," "essentially," "about," and other approximation-indicating terms used above represent a reasonable amount of deviation that does not bring about a considerable change as a result. Terms that represent these approximations should be interpreted so as to include an error of about ±5% at least, as long as there is no considerable change due to the deviation.

The embodiments described above constitute some of the possible embodiments of the present invention, and it is apparent to those skilled in the art that it is possible to add modifications to the above-described embodiments by using the above-described disclosure without exceeding the range of the present invention as defined in the claims. The above-described embodiments furthermore do not limit the range of the present invention, which is defined by the accompanying claims or equivalents thereof, and are only designed to provide a description of the present invention.

This specification claims priority to Japanese Patent Application No. 2005-048269, and all of the disclosures of Japanese Patent Application No. 2005-048269 are hereby incorporated by reference.

[Key to Symbols]

10, 10A, 10B: wristwatches (electronic apparatuses), 11: needle movement mechanism (time display unit), 12: drive unit, 13: power supply, 30: drive motor, 40: oscillation unit, 41, 41*a*: crystal oscillators (reference oscillators), 41*b*: frequency adjustment unit, 42: atomic oscillator (high-precision oscillator), 43, 44, 43*b*: dividers, 45: comparator circuit, 46, 46*c*: correction units, 46*a*: memory (storage unit), 46*b*: pacing logic circuit, 46*d*: variable capacitance circuit, 47: intermittent time management unit, 49: intermittently driven unit, 50: motor drive unit, 60: battery, 65: sensor, 70: first detector (reference oscillator effect information detector), 71: temperature detector, 72: voltage detector, 73: posture detector, 80: second detector (high-precision oscillator effect information detector), 81: magnetic field detector, CL0: clock signal (output clock signal), CL1: reference clock signal, CL2, CL3: clock signals, CL4: comparison signal, D1, D2: correction data, P1: update period (correction data update period), P2: temperature detection interval

What is claimed is:

1. A clock signal output device, comprising:

a reference oscillator generating a reference clock signal;

a first divider circuit obtaining said reference clock signal from said reference oscillator and outputting a comparison signal and an output clock signal, said reference oscillator being a crystal oscillator;

an intermittently driven unit having a high-precision oscillator generating a high-precision clock signal having higher precision than said reference oscillator, dividing said high-precision clock signal and generating a clock signal, comparing said comparison signal and said clock signal, and outputting first correction data, said high-precision oscillator being an atomic oscillator;

an intermittent drive unit intermittently driving said high-precision; and a correction unit obtaining said first correction data from said intermittently driven unit each time when said high-precision oscillator is driven, and outputting a pacing signal to said first divider circuit on the basis of said first correction data, wherein said first divider circuit outputs said output clock signal on the basis of said pacing signal, fluctuation of frequency deviation of said crystal oscillator due to an aging characteristic of said crystal oscillator is corrected to frequency deviation of said atomic oscillator by intermittently driving said atomic oscillator.

2. The clock signal output device according to claim 1, wherein said intermittently driven unit includes a second divider circuit dividing said high-precision clock signal and outputting said clock signal, and a comparator comparing said clock signal and said comparison signal and outputting said first correction data.

3. The clock signal output device according to claim 2, wherein said intermittent driving unit drives said comparator only during the interval in which said high-precision oscillator is driven.

4. The clock signal output device according to claim 2, wherein said correction unit includes a storage unit storing said first correction data, and a pacing logic circuit generating said pacing signal on the basis of said first correction data.

5. The clock signal output device according to claim 4, wherein said intermittent drive unit includes a counter counting said output clock signals and measuring the driving stop time of said high-precision oscillator.

6. The clock signal output device according to claim 5, wherein said intermittent drive unit drives said high-precision oscillator for a prescribed period of time in prescribed cycles.

7. A clock signal output device comprising:

a reference oscillator generating a reference clock signal;

a first divider circuit obtaining said reference clock signal from said reference oscillator and outputting a comparison signal and an output clock signal;

an intermittently driven unit having a high-precision oscillator generating a high-precision clock signal having higher precision than said reference oscillator, dividing said high-precision clock signal and generating a clock signal, comparing said comparison signal and said clock signal, and outputting first correction data;

an intermittent drive unit intermittently driving said high-precision oscillator; and a correction unit obtaining said first correction data from said intermittently driven unit each time when said high-precision oscillator is driven, and outputting a pacing signal to said first divider circuit on the basis of said first correction data, wherein said first divider circuit outputs said output clock signal on the basis of said pacing signal, and said intermittent drive unit extends the intermittent driving cycle in a stepwise fashion in accordance with the aging characteristics of said reference oscillator.

8. A clock signal output device comprising:

a reference oscillator generating a reference clock signal;

a first divider circuit obtaining said reference clock signal from said reference oscillator and outputting a comparison signal and an output clock signal;

an intermittently driven unit having a high-precision oscillator generating a high-precision clock signal having higher precision than said reference oscillator, dividing said high-precision clock signal and generating a clock signal, comparing said comparison signal and said clock signal, and outputting first correction data;

an intermittent drive unit intermittently driving said high-precision oscillator;

a correction unit obtaining said first correction data from said intermittently driven unit each time when said high-precision oscillator is driven, and outputting a pacing signal to said first divider circuit on the basis of said first correction data; and a reference oscillator effect information detector detecting reference oscillator effect information that affects the operation of the reference oscillator, wherein said first divider circuit outputs said output clock signal on the basis of said pacing signal, when said reference oscillator effect information is not an initially detected value, said first divider circuit corrects said output clock signal on the basis of said first correction data that corresponds to the value of said reference oscillator effect information stored in said storage unit, and when said reference oscillator effect information is the initially detected value, said intermittent drive unit drives said high-precision oscillator, said correction unit receives second correction data and stores said second correction data in said storage unit, and said first divider circuit corrects said output clock signal on the basis of said second correction data.

9. The clock signal output device according to claim 8, wherein said reference oscillator effect information detector includes at least one detector selected from a temperature detector detecting temperature, a voltage detector detecting power-supply voltage, an posture detector detecting the posture of said clock signal output device, and a magnetic field detector detecting magnetic fields.

10. The clock signal output device according to claim 7, wherein said reference oscillator is a crystal oscillator, a CR oscillator, or a MEMS oscillator.

11. The clock signal output device according to claim 7, wherein said high-precision clock signal is a signal having a higher frequency than said reference clock signal.

12. The clock signal output device according to claim 7, wherein said high-precision oscillator is an oscillator in which an atomic oscillator, a temperature-compensated crystal oscillator, a oven controlled crystal oscillator, or an AT-cut oscillator is used.

13. A clock signal output device, comprising:

a reference oscillation unit generating a reference clock signal, said reference oscillator being a crystal oscillator;

a high precision oscillation unit generating a high-precision clock signal having higher precision than said reference oscillation unit, said high precision oscillator being an atomic oscillator;

an output clock signal output unit correcting said reference clock signal on the basis of said high-precision clock signal and outputting an output clock signal; and an intermittent driving unit intermittently driving said high precision oscillation unit, wherein fluctuation of frequency deviation of said crystal oscillator due to an aging characteristic of said crystal oscillator is corrected to frequency deviation of said atomic oscillator by intermittently driving said atomic oscillator.

14. The clock signal output device according to claim 13, wherein said output clock signal output unit includes a clock signal generation unit dividing said high-precision clock signal and generating a clock signal.

15. The clock signal output device according to claim 14, wherein said output clock signal output unit includes a correction data output unit comparing said reference clock signal and said clock signal and outputting correction data.

16. The clock signal output device according to claim 15, wherein said output clock signal output unit includes a pacing logic unit outputting a pacing signal on the basis of said correction data.

17. The clock signal output device according to claim 16, wherein said intermittent driving unit includes a counter unit for counting said output clock signals and measuring the driving stop time of said high precision oscillation unit.

18. A timepiece comprising:

a clock signal output device including a reference oscillator generating a reference clock signal;

a first divider circuit obtaining said reference clock signal from said reference oscillator and outputting a comparison signal and an output clock signal, said reference oscillator being a crystal oscillator;

an intermittently driven unit having a high-precision oscillator generating a high-precision clock signal having higher precision than said reference oscillator, dividing said high-precision clock signal and generating a clock signal, comparing said comparison signal and said clock signal, and outputting first correction data, said high-precision oscillator being an atomic oscillator;

an intermittent drive unit intermittently driving said high-precision oscillator; and a correction unit obtaining said first correction data from said intermittently driven unit each time when said high-precision oscillator is driven, and outputting a pacing signal to said first divider circuit on the basis of said first correction data; wherein said first divider circuit outputs said output clock signal on the basis of said pacing signal, the first divider circuit includes a driven unit and a drive unit for driving the driven unit on the basis of said output clock signal, fluctuation of frequency deviation of said crystal oscillator due to an aging characteristic of said crystal oscillator is corrected to frequency deviation of said atomic oscillator by intermittently driving said atomic oscillator, and said driven unit includes a time display unit displaying time information on the basis of said output clock signal.

19. The clock signal output device according to claim 8, wherein said reference oscillator is a crystal oscillator, a CR oscillator, or a MEMS oscillator.

20. The clock signal output device according to claim 8, wherein said high-precision clock signal is a signal having a higher frequency than said reference clock signal.

21. The clock signal output device according to claim 8, wherein said high-precision oscillator is an oscillator in which an atomic oscillator, a temperature-compensated crystal oscillator, a oven controlled crystal oscillator, or an AT-cut oscillator is used.

* * * * *